United States Patent
Bagung

(10) Patent No.: US 8,624,130 B2
(45) Date of Patent: Jan. 7, 2014

(54) CIRCUIT BOARD HAVING GROWN METAL LAYER IN A FLEXIBLE ZONE

(75) Inventor: Detlev Bagung, Bernhardswald (DE)

(73) Assignee: Continental Automotive GmbH, Hannover (DE)

( * ) Notice: Subject to any disclaimer, the term of this patent is extended or adjusted under 35 U.S.C. 154(b) by 229 days.

(21) Appl. No.: 13/140,091

(22) PCT Filed: Nov. 30, 2009

(86) PCT No.: PCT/EP2009/066054
§ 371 (c)(1),
(2), (4) Date: Jul. 12, 2011

(87) PCT Pub. No.: WO2010/072516
PCT Pub. Date: Jul. 1, 2010

(65) Prior Publication Data
US 2011/0284275 A1   Nov. 24, 2011

(30) Foreign Application Priority Data
Dec. 16, 2008  (DE) .......................... 10 2008 062 516

(51) Int. Cl.
*H05K 1/11*  (2006.01)
*H05K 1/02*  (2006.01)

(52) U.S. Cl.
CPC ................................. *H05K 1/0278* (2013.01)
USPC ........................................ 174/261; 174/262

(58) Field of Classification Search
CPC .................................................. H05K 1/0278
USPC .......... 174/254, 261, 262; 257/777, 778, 783; 29/852
See application file for complete search history.

(56) References Cited

U.S. PATENT DOCUMENTS

| | | | | |
|---|---|---|---|---|
| 4,604,799 | A * | 8/1986 | Gurol ............................... | 29/847 |
| 2007/0116932 | A1 | 5/2007 | Van Der Tempel | |
| 2007/0277998 | A1 | 12/2007 | Suzuki et al. | |
| 2007/0281499 | A1 | 12/2007 | Muro et al. | |
| 2008/0093110 | A1 * | 4/2008 | Bagung ......................... | 174/254 |
| 2008/0186247 | A1 * | 8/2008 | Cotte et al. .................... | 343/841 |

FOREIGN PATENT DOCUMENTS

| | | |
|---|---|---|
| DE | 44 05 228 C1 | 7/1995 |
| DE | 102005012404 A1 | 9/2006 |
| JP | 2005236205 A | 9/2005 |
| JP | 2006015602 A | 1/2006 |
| WO | 2005/033787 A1 | 4/2005 |
| WO | 2007/064138 A1 | 6/2007 |

* cited by examiner

*Primary Examiner* — Yuriy Semenenko
(74) *Attorney, Agent, or Firm* — Laurence A. Greenberg; Werner H. Stemer; Ralph E. Locher

(57) ABSTRACT

A circuit board has a grown metal layer in a flexible zone. A circuit board has a first part, a second part and a recess in the circuit board that is arranged between the first part and the second part. A thickness of the circuit board reduced in the region of the recess. The first part can be pivoted relative to the second part as a result of the recess. The flexibility of the circuit board is improved in the range of the recess by a metal layer applied on a surface section of the circuit board in the recess by deposition. Furthermore, EMC problems can be reduced by the metal layer on a side wall of the recess and electrical contacts to conductor path metallization layers can be created.

10 Claims, 2 Drawing Sheets

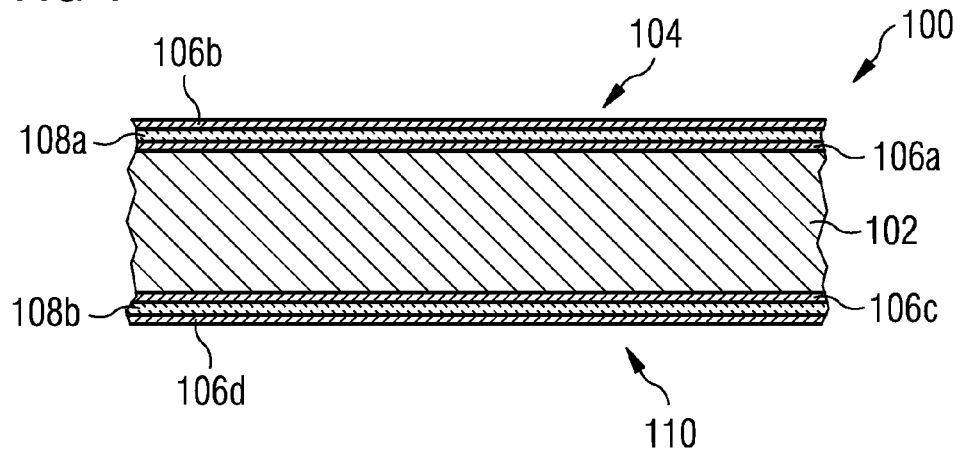
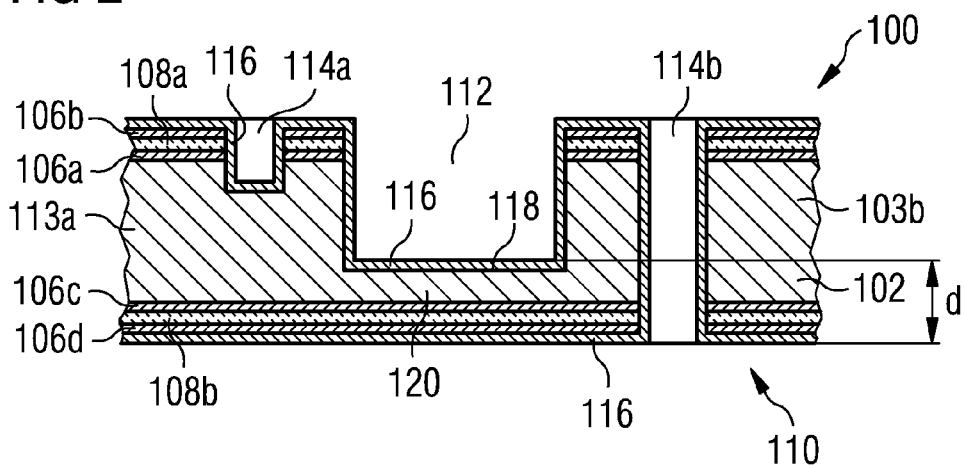
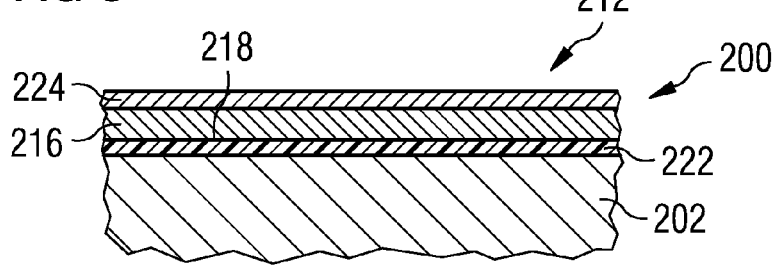

CIRCUIT BOARD HAVING GROWN METAL LAYER IN A FLEXIBLE ZONE

The invention relates to a circuit board, and to a method for producing a circuit board.

BACKGROUND OF THE INVENTION

DE 10 2005 102 404 B4 discloses a circuit board having a first, a second and a third rigid region and a first and a second flexible region. The flexible regions are made thinner than the rigid regions perpendicularly to the sides of the circuit board, wherein the flexible regions are formed by depth milling of the circuit board. The flexible region comprises a layer for conductor tracks, a protective layer above the layer for conductor tracks, and a residual layer of circuit board material on a side of the layer for conductor tracks which is opposite to the protective layer.

The flexibility of the flexible region is restricted by the circuit board material conventionally used.

WO 2007/064138 A1 discloses a circuit board having a first and a second part, wherein a depression is arranged between the first and second parts. A metal layer is applied on the surface of the circuit board by means of a sputtering process.

DE 44 05 228 C1 and WO 2005/033787 A1 likewise disclose circuit boards having a plurality of sections, wherein at least one section has a depression.

SUMMARY OF THE INVENTION

The invention is based on the object of providing a circuit board and a method for producing said circuit board, wherein the circuit board has improved characteristics.

This object is achieved by means of the subjects of the independent patent claims. Advantageous embodiments of the present invention are described in the dependent claims.

In accordance with a first aspect of the subjects disclosed herein, a circuit board is provided, which has a first part, a second part and a depression, wherein the depression is arranged between the first part and the second part and reduces a thickness of the circuit board in the region of the depression, and wherein, on account of the depression, the first part is pivotable relative to the second part. A grown metal layer is arranged on a surface section of the circuit board in the depression. The first and second parts thus defined are also designated as rigid regions, while the region of the depression is also designated as flexible region.

In accordance with the first aspect, the metal layer is applied by being grown onto the surface section of the circuit board in the depression. In this case, the growth can be effected by any suitable method, e.g. by growth from a solution, for example electroless or electrical plating, chemical deposition, vapor deposition, cathode sputtering, etc. It goes without saying that the metal layer, in addition to the surface section mentioned, can also be grown onto regions outside the depression. In accordance with one embodiment for depositing the metal layer, the entire circuit board is dipped into a corresponding solution, as a result of which, depending on the method, the metal layer is deposited on the entire surface of the circuit board or on electrically biased surface sections of the circuit board. The circuit board has at least one contact hole in the circuit board, e.g. in the first or the second part. A metal layer is arranged in the contact hole, wherein the metal layer in the at least one contact hole and the metal layer on the surface section in the depression are formed from the same material.

In accordance with one embodiment, a contact hole is formed in at least one of the two parts of the circuit board. By way of example, the circuit board can have at least two electrical conductors which are arranged at a distance from one another in a direction perpendicular to a board plane of the relevant part, wherein the metal layer in the at least one contact hole electrically conductively connects the at least two electrical conductors.

In accordance with a further embodiment, the circuit board has an insulation layer composed of an electrically insulating material. By way of example, the insulation layer can be formed from FR4 material. In accordance with a further embodiment, the depression extends into the insulation layer and insulating material of the insulation layer extends below the depression between the first part and the second part. In other words, the depression does not extend completely through the insulation layer, but rather only into a specific depth into the insulation layer. In accordance with one embodiment, the insulating material below the depression can form at least one part of the surface section in the depression on which the metal layer is grown.

In accordance with one embodiment, the metal layer covers a bottom of the depression. Furthermore, the metal layer can also cover a part or the entirety of the side walls of the depression.

The metal layer grown on the bottom of the depression improves the flexibility of the circuit board in the region of the depression, that is to say in the flexible region. This is possibly attributable to a good covering of cracks and fractures by the metal layer. Furthermore, fracture of fibers in or near the surface of the circuit board is evidently reduced.

Furthermore, by growing the metal layer on a surface section of a side wall of the depression, it is possible to reduce problems of electromagnetic compatibility (EMC problems) or to improve the EMC. Furthermore, by growing the metal layer on a surface section of a side wall, it is possible to produce electrical contacts to conductor track metallization layers.

In one embodiment, the metal layer is formed from copper. In accordance with a further embodiment, the metal layer contains copper.

In accordance with a further embodiment, a covering layer for covering the metal layer is arranged above the metal layer.

In accordance with a second aspect of the subjects disclosed herein, a method for producing a circuit board is provided, said method comprising: (i) producing a depression in a circuit board and thereby defining a first part and a second part of the circuit board, wherein, on account of the depression, the first part is pivotable relative to the second part, and (ii) growing a metal layer in the depression. Furthermore, the method comprises producing at least one contact hole in the circuit board, wherein applying the metal layer into the depression and into the at least one contact hole is effected simultaneously by the same process sequence. In this case, applying the metal layer can consist of a single process step, or can consist of a plurality of steps, for example, as explained above, applying an electrically conductive layer that is subsequently plated. Additionally or alternatively, the process sequence can comprise e.g. applying adhesion promoting layers, seed layers, etc.

In accordance with one embodiment of the method, a starting circuit board, in which the depression is produced, can already have a preliminary stage of the depression, e.g. a premilled portion. In accordance with a further embodiment, in the premilled portion it is possible to arrange a circuit board element, for example a conductor track metallization layer, which is then removed by step (i), that is to say by producing the depression in the region of the depression.

One embodiment of the method in accordance with a second aspect furthermore comprises applying an electrically conductive layer to the surface section in the depression, wherein growing the metal layer comprises plating the electrically conductive layer.

In a further embodiment of the method in accordance with the second aspect, prior to growing the metal layer, the circuit board has, on at least one of the first part and the second part, an outer conductor track metallization layer. The conductor track metallization layer can be, for example, a film applied on an insulation layer of the circuit board. The conductor track metallization layer can already be patterned before the growth of the metal layer in the depression. Alternatively, the conductor track metallization layer can be unpatterned upon the growth of the metal layer in the depression. In accordance with a further embodiment, the circuit board already has the outer conductor track metallization layer before the depression is produced.

In accordance with a further embodiment, the conductor track metallization layer is arranged on a first side of the circuit board and the depression is likewise arranged on the first side of the circuit board, that is to say that the conductor track metallization layer and the depression are arranged on the same side of the circuit board.

In accordance with a further embodiment, the depression in the circuit board is produced by mechanical processing, e.g. by milling, grinding, etc.

Further advantages and features of the present invention will become apparent from the following exemplary description of currently preferred embodiments. The individual figures of the drawings of this application should be regarded merely as schematic and as not true to scale.

BRIEF DESCRIPTION OF THE DRAWINGS

FIG. 1 shows a sectional view of a circuit board in a first production stage.

FIG. 2 shows a sectional view of the circuit board from FIG. 1 in a further advanced production stage in accordance with illustrative embodiments of the subjects disclosed herein.

FIG. 5 shows a sectional view of a circuit board in accordance with illustrative embodiments of the subjects disclosed herein.

DETAILED DESCRIPTION

Figure 3:
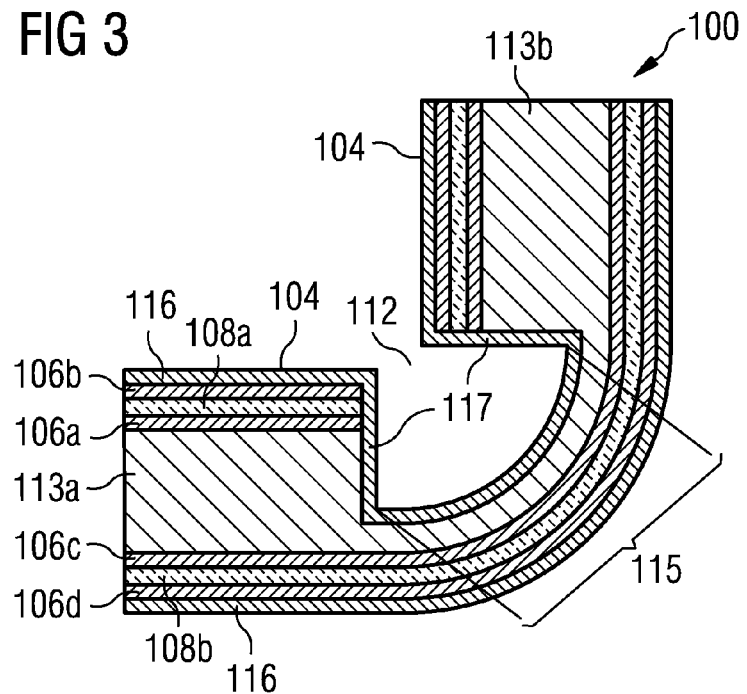
FIG. 3 shows the circuit board from FIG. 2 in a first bending state.

In the drawings, identical, functionally identical or mutually corresponding components and features are provided with the same reference symbols, or with reference symbols which differ from one another in their first digit or an appended letter, and are not explained in detail again.

FIG. 1 shows a sectional illustration of a circuit board 100 in a first production stage in accordance with illustrative embodiments of the subjects disclosed herein. The circuit board 100 herein has an insulation layer 102 composed of an electrically insulating material. A typical material for the electrically insulating material is a composite composed of fibers and a binder such as, for example, resin, for example glass fibers and resin, such as FR4. In accordance with an embodiment illustrated in FIG. 1, the insulation layer 102 is formed as a circuit board core. On a top side 104 of the circuit board 100, there is arranged on the insulation layer 102 an inner upper conductor track metallization layer 106a, thereon an upper insulation layer 108a and thereon in turn an outer upper conductor track metallization layer 106b. In accordance with one embodiment, the conductor track metallization layers 106a, 106b are formed from metal films, for example copper films, as illustrated in FIG. 1. In accordance with one embodiment, the upper insulation layer 108a between the upper conductor track metallization layers 106a and 106b is a prepreg (preimpregnated fiber) layer. An underside 110 of the circuit board 100 is constructed analogously to the top side 104 and comprises on the insulation layer 102 an inner lower conductor track metallization layer 106c, thereon a lower insulation layer 108b and thereon in turn an outer lower conductor track metallization layer 106d. The designations "upper" and "lower" serve here merely for explanation with respect to FIG. 1 and should not be interpreted as restrictive in any regard whatsoever.

In accordance with one embodiment, the circuit board 100 in the first production stage, as illustrated in FIG. 1, forms the basis for further production steps in accordance with the subjects disclosed herein.

FIG. 2 shows a sectional illustration of the circuit board 100 in a further advanced production stage in accordance with illustrative embodiments of the subjects disclosed herein. In the production stage illustrated in FIG. 2, a depression 112 is formed in the circuit board 100, for example by depth milling known per se.

The depression 112 defines two parts of the circuit board, a first part 113a and a second part 113b on both sides of the depression. The depression 112 reduces the thickness of the circuit board 100 to a value d, as a result of which a flexible region of the circuit board 100 is formed in the region of the depression 112, such that the first part 113a is pivotable relative to the second part 113b. It goes without saying that the circuit board in accordance with other embodiments can have two or more depressions and hence two or more flexible regions. In this way it is possible to realize virtually any desired and very complex geometries with the circuit board.

In the circuit board 100 illustrated in FIG. 2, contact holes 114a, 114b were furthermore formed. In accordance with one embodiment, a (first) contact hole 114a is embodied as a blind hole that does not completely penetrate through the circuit board 100. In accordance with a further embodiment, a (second) contact hole 114b is embodied as a through-hole. In accordance with one embodiment illustrated in FIG. 2, the circuit board has two electrical conductors, namely the upper conductor track metallization layers 106a and 106b, which are arranged at a distance from one another in a direction perpendicular to a board plane of the relevant first part 113a.

In accordance with a further embodiment illustrated in FIG. 2, the circuit board has four electrical conductors, namely the upper and lower conductor track metallization layers 106a, 106b, 106c, 106d, which are arranged at a distance from one another in a direction perpendicular to a board plane of the relevant first part 113b.

In accordance with one embodiment illustrated in FIG. 2, the metal layer 116 also covers that side 110 of the circuit board 100 which is remote from the depression, in the present case the outer conductor track metallization layer 106d. This can occur during electroless plating, for example, if the circuit board 100 is completely immersed in the plating solution. In accordance with another embodiment, the surfaces or surface sections of the circuit board 100, at least the surfaces or the surface section 118 in the depression 112, are selectively coated with the metal layer 116, for example by electroplating.

In accordance with a further embodiment, the surface section 118 forming the depression 112 is covered with a metal layer by the metal layer being grown on the surface section 118. In accordance with one embodiment, the metal layer 116 on the surface section in the depression 112 is the same metal layer 116 that is also formed in the contact holes 114a, 114b for making electrical contact with the relevant electrical conductors 106a, 106b, 106c, 106d, that is to say that the metal layer 116 in the contact holes and the metal layer 116 in the depression 112 are produced by means of the same process sequence. The thickness of the metal layer in the depression can assume, for example, a value of between 10 micrometers (μm) and 80 micrometers or, in accordance with another embodiment, a value of between 25 micrometers and 50 micrometers. Depending on the growth method, the layer thickness can be smaller in the contact hole than in the depression.

In accordance with one embodiment illustrated in FIG. 2, the metal layer 116 also covers that side 110 of the circuit board 100 which is remote from the depression, in the present case the outer conductor track metallization layer 106d. This can occur during electroless plating, for example, if the circuit board 100 is completely immersed in the plating solution. In accordance with another embodiment, surface sections of the circuit board 100, at least the surface section 118 in the depression 112, are selectively coated with the metal layer 116, for example by electroplating.

In accordance with one embodiment, the depression 112 extends into an insulation layer, in the present case the insulation layer 102, wherein insulation material of the insulation layer 102 remains in a region 120 below the depression 112. This has the advantage that the inner lower conductor track 106c is insulated from the metal layer 116 without further measures.

FIG. 3 shows a part (without contact holes 114a, 114b) of the sectional view of the circuit board 100 from FIG. 2 in a bent state in which the first part 113a is pivoted relative to the second part 113b into a first pivoted position, wherein the top sides 104 of the two parts 113a, 113b are pivoted toward one another. In accordance with one embodiment illustrated in FIG. 3, a bottom 115 of the depression 112 is concavely flexible or bent.

FIG. 3 shows a part (without contact holes 114a, 114b) of the sectional view of the circuit board 100 from FIG. 2 in a bent state in which the first part 113a is pivoted relative to the second part 113b into a second pivoted position, wherein the undersides 110 of the two parts 113a, 113b are pivoted toward one another. In accordance with one embodiment illustrated in FIG. 4, the bottom 115 of the depression 112 is convexly flexible or bent.

Figure 4:
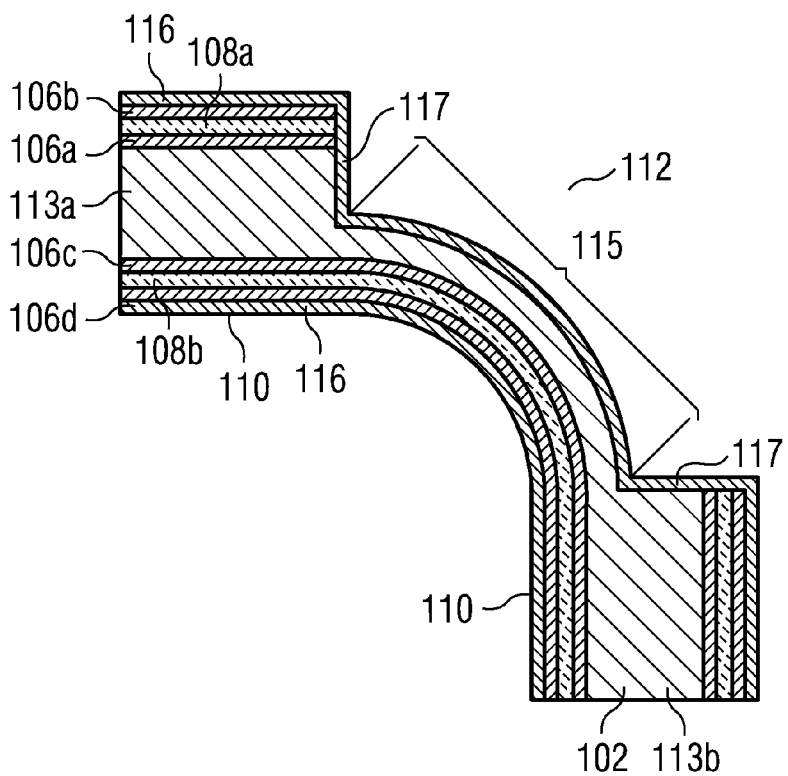
FIG. 4 shows the circuit board from FIG. 2 in a second bending state.

In accordance with one embodiment, the conductor track metallization layers lie on an outer side of the bending radius (as illustrated in FIG. 3). The metal layer 116 surprisingly improves the flexibility in this case. Opposite bending (FIG. 4) can give rise to the risk of fracture as a result of the spreading of milled glass node points. This risk of fracture is eliminated or at least reduced by the metal layer 112 in the depression. By virtue of the metal layer 116 in the depression 112, it is therefore also possible to effect bending in the other direction, such that the conductor track metallization layers lie on an inner side of the bending radius, as illustrated in FIG. 4.

Consequently, the flexibility of the bottom 115 of the depression 112 is improved by the metal layer 116 on the bottom 115. In accordance with one embodiment, therefore, at least the bottom 115 of the depression is covered with the metal layer 116.

In accordance with a further embodiment, at least one wall section 117 of the depression, that is to say a surface or surface section extending transversely with respect to a board plane or an edge of the depression 112, is covered with the metal layer. This has the advantage of improved EMC protection. Furthermore, the metal layer 112 on the at least one wall section 117 can serve as an electrical contact, e.g. as an electrical ground link. For this purpose, a side wall of the depression can be completely or partly covered with the metal layer. A complete covering has the advantage that the entire circuit board can be processed without the metal layer 116 having to be deposited selectively on the at least one wall section 117. In this case, in particular, the metal layer in the depression and the metal layer in the contact holes are produced together, that is to say by means of the same process sequence.

In accordance with one embodiment, the metal layer 116 on a wall section 117 of the depression 112 can make electrical contact with one or more conductor track metallization layers, e.g. outer conductor track metallization layers 106b and/or inner conductor track metallization layers 106a.

It goes without saying that the conductor track metallization layers 106a, 106b, 106c, 106d and, in particular, also the outer conductor track metallization layers 106b, 106d and the metal layer 116 possibly deposited thereon have been or are suitably patterned in accordance with the desired electrical connections to be produced. By way of example, for a corresponding electrical interconnection to the metal layer 116 on the wall section 117, the outer upper conductor track metallization layer 106b and the metal layer 116 can be suitably patterned by patterning methods known per se (not illustrated in FIG. 2, FIG. 3 and FIG. 4). In accordance with one embodiment, the metal layer (116) can be patterned not only in the region of the conductor track metallization layers 106b, 106d, but also in the depression (112).

By way of example, in accordance with one embodiment, inner conductor track metallization layers 106a, 106c are patterned before the insulation layer 108a, 108b and subsequent conductor track metallization layers 106b, 106d are arranged on the inner conductor track metallization layers.

In accordance with one embodiment, the outer conductor track metallization layers 106b, 106d are patterned only after the application of the metal layer 116, and hence together with the metal layer 116. In accordance with one embodiment, the outer conductor track metallization layers 106b, 106d are patterned before the metal layer 116 is deposited. The deposition, that is to say the growth of the metal layer 116, can in this case be effected efficiently by electrical plating, for example, such that the metal layer 116 is deposited selectively only on the remaining sections of the conductor track metallization layer and on the correspondingly prepared surface section 118 of the depression 112.

The remaining reference numerals presented in FIG. 3 and in FIG. 4 designate the same features as the corresponding reference numerals in FIG. 2, and the description of these features will not be repeated here.

Protective layers such as soldering resist, for example, are not illustrated in FIG. 2, FIG. 3 and FIG. 4. However, the person skilled in the art recognizes that one or a plurality of such layers can be applied on the circuit board, in particular on the metal layer (116), without departing from the principles of the subjects disclosed herein.

FIG. 5 shows, in a sectional illustration, a part of a circuit board 200 in a depression 212, which, apart from the difference explained below, is embodied identically to the depression 112 in FIG. 2, the details of which will not be repeated here.

While in FIG. 2 the metal layer was grown directly on the insulation layer 102 by a suitable method, FIG. 5 shows an embodiment in which firstly a preliminary layer 222 was applied to a surface section 218 of the insulation layer 202 in the depression 212, which supports the growth of the metal layer 216. By way of example, the preliminary layer 222 can be an adhesion promoting layer. In accordance with a further embodiment illustrated in FIG. 5, the preliminary layer is an electrically conductive layer that enables the metal layer 216 to be grown by electrical plating (electroplating). It goes without saying that, in embodiments in which the metal layer 216 also covers contact holes (not illustrated in FIG. 5), the contact holes can also have the preliminary layer 222.

Depending on its composition, the preliminary layer 222 is applied by suitable methods known to those skilled in the art, for example by chemical deposition.

Furthermore in contrast to the circuit board 100 in FIG. 2, the circuit board illustrated in FIG. 5, in accordance with one embodiment, has at least one covering layer 224 above the metal layer 216. The covering layer 224 is illustrated only in the region of the depression 212 in FIG. 5. It goes without saying that the covering layer can be applied on the entire circuit board or, in accordance with another embodiment, can be applied merely in partial regions of the circuit board. The covering layer 224 can be designed, for example, to protect the metal layer 216 against corrosion. In accordance with other embodiments, the covering layer can be any other suitable layer, for example a metallic or organic layer. In particular, the covering layer 224 can be a layer that fulfils a specific function, for example an Ni/Au layer, a soldering resist or OSP.

Embodiments of the subjects disclosed herein make it possible, through the metal layer 116 in the depression 112, to bend the circuit board 100 in both directions, as illustrated in FIG. 3 and FIG. 4, or to increase the bending angle.

It is pointed out that the embodiments described here merely constitute a limited selection of possible embodiment variants of the invention. Thus, it is possible to combine the features of individual embodiments with one another in a suitable manner, such that, with the embodiment variants explicit here, a multiplicity of different embodiments should be regarded as being disclosed in an obvious manner to the person skilled in the art. Furthermore, the features illustrated in the drawings should be understood merely by way of example for elucidating principles and advantages of the subjects disclosed herein. Thus, by way of example, a circuit board can have more or fewer conductor track metallization layers than illustrated in the drawings. Furthermore, by way of example, the circuit board in which the depression is formed, in a departure from exemplary embodiments disclosed herein, can be formed in any manner desired. Furthermore, it should be mentioned that terms such as "one" or "a" do not preclude a plurality. Terms such as "containing" or "having" do not preclude further features or method steps.

To summarize, it should be emphasized that:

A circuit board contains a first part, a second part and a depression in the circuit board, which is arranged between the first part and the second part and reduces a thickness of the circuit board in the region of the depression, wherein, on account of the depression, the first part is pivotable relative to the second part. A metal layer applied on a surface section of the circuit board in the depression by growth improves the flexibility of the circuit board in the region of the depression. Furthermore, the metal layer on a side wall of the depression makes it possible to reduce EMC problems and to produce electrical contacts to conductor track metallization layers.

The invention claimed is:

1. A circuit board, comprising: a first part; a second part; a depression in the circuit board formed between said first part and said second part, said depression reducing a thickness of the circuit board in a region of said depression, and rendering said first part pivotable relative to said second part; a metal layer grown on a surface of the circuit board in said depression; the circuit board having at least one contact hole formed therein; a metal layer in said at least one contact hole; wherein said metal layer in said at least one contact hole and said metal layer on the surface in said depression are formed from a common material,
   wherein: said metal layer in said at least one contact hole and said metal layer on the surface in said depression are electrically conductively connected.

2. The circuit board according to claim 1, wherein:
   the circuit board further comprises an insulation layer composed of an electrically insulating material;
   said depression extends into said insulation layer; and
   an insulating material of said insulation layer extends below the depression between said first part and said second part and forms at least one part of the surface in said depression on which said metal layer is grown.

3. The circuit board according to claim 1, wherein said metal layer on the surface in said depression covers a bottom of said depression.

4. The circuit board according to claim 3, wherein said metal layer on the surface in said depression further covers side walls of said depression.

5. The circuit board according to claim 1, wherein said metal layer on the surface in said depression consists of copper.

6. The circuit board according to claim 1, wherein said metal layer on the surface in said depression contains copper.

7. A method of producing a circuit board, the method which comprises: forming a depression in a circuit board to thereby define a first part of the circuit board and a second part of the circuit board, wherein, on account of the depression the first part is pivotable relative to the second part; forming at least one contact hole in the circuit board; and growing a metal layer in the depression and applying a metal layer in the at least one contact hole in one and the same process sequence,
   which comprises: performing the step of growing the metal layer in the depression and applying the metal layer in the at least one contact hole such that the metal layer in the depression and the metal layer in the at least one contact hole are electrically conductively connected.

8. The method according to claim 7, which comprises:
   applying an electrically conductive layer to a surface in the depression; and
   wherein growing the metal layer comprises plating the electrically conductive layer.

9. The method according to claim 7, wherein:
   prior to growing the metal layer, the circuit board has, on at least one of the first part and the second part, an outer conductor track metallization layer on the circuit board; and
   the outer conductor track metallization layer is disposed on a first side of the circuit board and the depression is likewise disposed on the first side of the circuit board.

10. The method according to claim 7, wherein the step of forming the depression in the circuit board comprises producing the depression by mechanical processing.

* * * * *